US011600318B2

(12) United States Patent
Golke (10) Patent No.: US 11,600,318 B2
(45) Date of Patent: Mar. 7, 2023

(54) MEMORY ARRAY WITH REDUCED LEAKAGE CURRENT (71) Applicant: Honeywell International Inc., Charlotte, NC (US)

(72) Inventor: Keith Golke, Minneapolis, MN (US)

(73) Assignee: Honeywell International Inc., Charlotte, NC (US)

(*) Notice: Subject to any disclaimer, the term of this patent is extended or adjusted under 35 U.S.C. 154(b) by 0 days.

(21) Appl. No.: 17/497,483

(22) Filed: Oct. 8, 2021

(65) Prior Publication Data
US 2022/0199147 A1 Jun. 23, 2022

Related U.S. Application Data (60) Provisional application No. 63/126,985, filed on Dec. 17, 2020.

(51) Int. Cl.
G11C 11/4094 (2006.01)
G11C 17/12 (2006.01)
G11C 11/4074 (2006.01)
G11C 11/4099 (2006.01)

(52) U.S. Cl.
CPC ...... *G11C 11/4094* (2013.01); *G11C 11/4074* (2013.01); *G11C 11/4099* (2013.01); *G11C 17/126* (2013.01)

(58) Field of Classification Search
None
See application file for complete search history.

(56) References Cited

U.S. PATENT DOCUMENTS

| 6,122,204 | A | * | 9/2000 | Poplevine | G11C 7/065 365/207 |
| 7,359,247 | B2 | | 4/2008 | Motoki | |
| 8,223,535 | B2 | * | 7/2012 | Bedeschi | G11C 13/003 365/163 |
| 8,750,018 | B2 | | 6/2014 | Youn et al. | |
| 8,902,641 | B2 | | 12/2014 | Chih et al. | |
| 8,923,040 | B2 | | 12/2014 | Lin et al. | |

(Continued)

OTHER PUBLICATIONS

Sreekala et al., "Leakage Estimation of SRAM cell based on Node Voltage and Current Characterization", International Journal of Pure and Applied Mathematics, vol. 118, No. 7, Mar. 2018, pp. 101-109.

*Primary Examiner* — Douglas King
(74) *Attorney, Agent, or Firm* — Shumaker & Sieffert, P.A.

(57) ABSTRACT

An apparatus for reading a bit of a memory array includes a bit cell column, voltage enhancement circuitry, and control circuitry. The voltage enhancement circuitry is configured to couple a bitline to a reference node. The control circuitry is configured to, in response to a read request for a bitcell element of a plurality of bitcell elements, couple a current source to the bitcell column such that a read current from the current source flows from the source line, through the bitcell column and the voltage enhancement circuitry, to the reference node and determine a state for the bitcell element based on a voltage between the source line and the reference node. The voltage enhancement circuitry is configured to generate, when the read current flows through the voltage enhancement circuitry, a voltage at the bitline that is greater than a voltage at the reference node.

20 Claims, 5 Drawing Sheets (56) References Cited

U.S. PATENT DOCUMENTS

| | | | |
|---|---|---|---|
| 9,972,373 B2 | 5/2018 | Andre et al. | |
| 10,008,257 B2 | 6/2018 | Kwack et al. | |
| 10,224,087 B1 | 3/2019 | Jung et al. | |
| 10,224,368 B2 | 3/2019 | Li et al. | |
| 10,311,952 B2 | 6/2019 | Yang et al. | |
| 10,325,647 B2 | 6/2019 | Sakhare et al. | |
| 2005/0047193 A1* | 3/2005 | Bedeschi | G11C 13/0026 365/148 |
| 2005/0201168 A1* | 9/2005 | Sugahara | G11C 11/412 365/203 |
| 2006/0262628 A1* | 11/2006 | Nii | G11C 11/412 365/226 |
| 2009/0040858 A1* | 2/2009 | Kengeri | G11C 11/412 365/227 |
| 2009/0046523 A1* | 2/2009 | Maki | G11C 29/83 365/226 |
| 2011/0063895 A1* | 3/2011 | Komatsu | G11C 11/413 365/156 |
| 2012/0147689 A1* | 6/2012 | Scheuerlein | G11C 13/0028 365/230.03 |
| 2013/0272060 A1* | 10/2013 | Andre | G11C 11/1693 365/158 |
| 2013/0308374 A1* | 11/2013 | Gogl | G11C 11/1659 365/158 |
| 2019/0088322 A1 | 3/2019 | Pyo et al. | |
| 2019/0164606 A1 | 5/2019 | Chih et al. | |

* cited by examiner

MEMORY ARRAY WITH REDUCED LEAKAGE CURRENT

PRIORITY CLAIM

This application claims benefit to U.S. Provisional Application No. 63/126,985, filed Dec. 17, 2020, the entire contents of which is incorporated herein by reference.

STATEMENT REGARDING FEDERALLY SPONSORED RESEARCH OR DEVELOPMENT

This invention was made with Government support under AFRL RFP Number FA9453-19-C-0010 awarded by Air Force Research Labs. The Government has certain rights in the invention.

TECHNICAL FIELD

The disclosure relates to computer memory circuitry.

BACKGROUND

A conventional memory array has control access circuitry, e.g., a transistor, in each memory array to select a bitcell element for both read operations and write operations. The access circuitry is designed to conduct a relatively large current during a write operation in order to coerce the bitcell element to a desired state, for example, high or low (1 or 0). During a read operation, the access circuitry may conduct a much smaller current in order to sense the state of the bitcell element without altering the stored state. The read operation therefore depends on sensing a small signal on a bitline. In a conventional memory array, thousands of bitcell cells are connected to the bitline and a sourceline.

SUMMARY

During a read operation, control circuitry may access, for a read operation, a particular bitcell element between a bitline and sourceline of a column of bitcell elements. While accessing the particular bitcell element, current leakage of other bitcell elements between the bitline and sourceline of the column of bitcell elements may reduce current through the read resistance and thus the voltage signal across the read resistance, thereby resulting in the resistance appearing smaller. The leakage current of other bitcell elements may cause the resulting read resistance signal (e.g., a difference between a read high resistance state of the particular bitcell element and a read low resistance state of the particular bitcell element) to be small enough that the control circuit cannot determine the resistance state of the particular bitcell element.

In accordance with the techniques of the disclosure, an apparatus for reading a bit of a memory array may be configured to reduce a gate-to-source voltage ($V_{GS}$) of unaccessed bitcell elements. For example, the apparatus may include voltage enhancement circuitry configured to increase a source voltage of unaccessed bitcell elements to be greater than a reference voltage (e.g., ground). In this way, the gate-to-source voltage ($V_{GS}$) of unaccessed bitcell elements may be less than zero, which may help to reduce leakage current, thereby improving an accuracy in determining the resistance state of an accessed bitcell element.

In one example, an apparatus for reading a bit of a memory array comprises a bitcell column comprising a plurality of bitcell elements arranged in parallel. Each bitcell element of the plurality of bitcell elements comprises a series string including a first terminal coupled to a source line and a second terminal coupled to a bitline. The series string comprises a switching element coupled in series with a resistive element. The voltage enhancement circuitry is configured to couple the bitline to a reference node. The apparatus further comprises control circuitry configured to, in response to a read request for a bitcell element of the plurality of bitcell elements, couple a current source to the bitcell column such that a read current from the current source flows from the source line, through the bitcell column and the voltage enhancement circuitry, to the reference node. The control circuitry is further configured to determine a state for the bitcell element based on a voltage between the source line and the reference node. The voltage enhancement circuitry is further configured to generate, when the read current flows through the voltage enhancement circuitry, a voltage at the bitline that is greater than a voltage at the reference node.

In another example, an apparatus for reading a bit of a memory array comprises a current source configured to generate a read current, a bitcell column, voltage enhancement circuitry, and control circuitry. The bitcell column comprises a plurality of bitcell elements arranged in parallel, each bitcell element of the plurality of bitcell elements comprising a series string including a first terminal coupled to a source line and a second terminal coupled to a bitline. The series string comprises a switching element coupled in series with a resistive element. The voltage enhancement circuitry is configured to couple the bitline to a reference node. The control circuitry is configured to, in response to a read request for a bitcell element of the plurality of bitcell elements, couple a current source to the bitcell column such that the read current from the current source flows from the source line, through the bitcell column and the voltage enhancement circuitry, to the reference node. The control circuitry is further configured to determine a state for the bitcell element based on a voltage between the source line and the reference node. The voltage enhancement circuitry is further configured to generate, when the read current flows through the voltage enhancement circuitry, a voltage at the bitline that is greater than a voltage at the reference node.

In one example, a method of operating a memory device includes receiving a read request for a bitcell element of a plurality of bitcell elements. The plurality of bitcell elements are arranged in parallel to form a bitcell column, each bitcell element of the plurality of bitcell elements comprising a series string including a first terminal coupled to a source line and a second terminal coupled to a bitline. The series string comprises a switching element coupled in series with a resistive element. The method further includes, in response to the read request, coupling a current source to the bitcell column such that a read current from the current source flows from the source line, through the bitcell column and voltage enhancement circuitry, to a reference node. The voltage enhancement circuitry is configured to generate, when the read current flows through the voltage enhancement circuitry, a voltage at the bitline that is greater than a voltage at the reference node. The method further includes determining a state for the bitcell element based on a voltage between the source line and the reference node.

The details of one or more examples of the disclosure are set forth in the accompanying drawings and the description below. Other features, objects, and advantages of the disclosure will be apparent from the description and drawings, and from the claims.

DETAILED DESCRIPTION

During a read operation of a memory array (e.g., magnetoresistive random-access memory (MRAM), resistive random access memory (RRAM), etc.), control circuitry may access, for a read operation, a particular bitcell element between a bitline and sourceline of a column of bitcell elements. The column of bitcell elements may include hundreds of bitcell elements, thousands of bitcell elements, or another number of bitcell elements. While accessing the particular bitcell element, current leakage of other bitcell elements between the bitline and sourceline of the column of bitcell elements may reduce an effective read resistance of the particular bitcell element that can be sensed between the sourceline and bitline.

For example, when a bitcell is in the off state, although unintended, a small amount of current may actually flow through the bitcell element. This small amount of current is leakage current. This leakage current may create a problem during the read operation. For example, many (e.g., hundreds, thousands, etc.) of unaccessed 'off' bitcell elements may leak current that is added to a current output by the single accessed bitcell element. While the leakage current from each of the unaccessed bitcell elements may be relatively small compared to current flow in the accessed bitcell element, the combined leakage current of all the unaccessed bitcell elements may interfere with a computing device sensing the intended signal developed by the accessed bitcell element during the read operation. For example, a computing device may erroneously read a bit as low or 0 due to the combined leakage current when the actual stored bit is a high or 1.

In accordance with the techniques of the disclosure, an apparatus for reading a bit of a memory array may be configured to reduce a gate-to-source voltage ($V_{GS}$) of unaccessed bitcell elements. Rather than relying on a voltage source to generate a negative voltage at the gate of unaccessed bitcell elements, voltage enhancement circuitry may increase a voltage at a source of unaccessed bitcell elements, which reduces the gate-to-source voltage ($V_{GS}$) of the unaccessed bitcell elements. For example, the voltage enhancement circuitry may be configured to increase a source voltage of unaccessed bitcell elements to be greater than a reference voltage (e.g., ground). The voltage enhancement circuitry may include a resistive element, a diode, a diode connected a metal-oxide-semiconductor field-effect transistor (MOSFET), or other voltage enhancement circuitry. In this way, the gate-to-source voltage ($V_{GS}$) of unaccessed bitcell elements may be less than zero, which may help to reduce leakage current, thereby improving an accuracy in determining the resistance state of an accessed bitcell element. The foregoing description assumes the access device is an Nch MOSFET, however, other access devices may be used.

Figure 1:
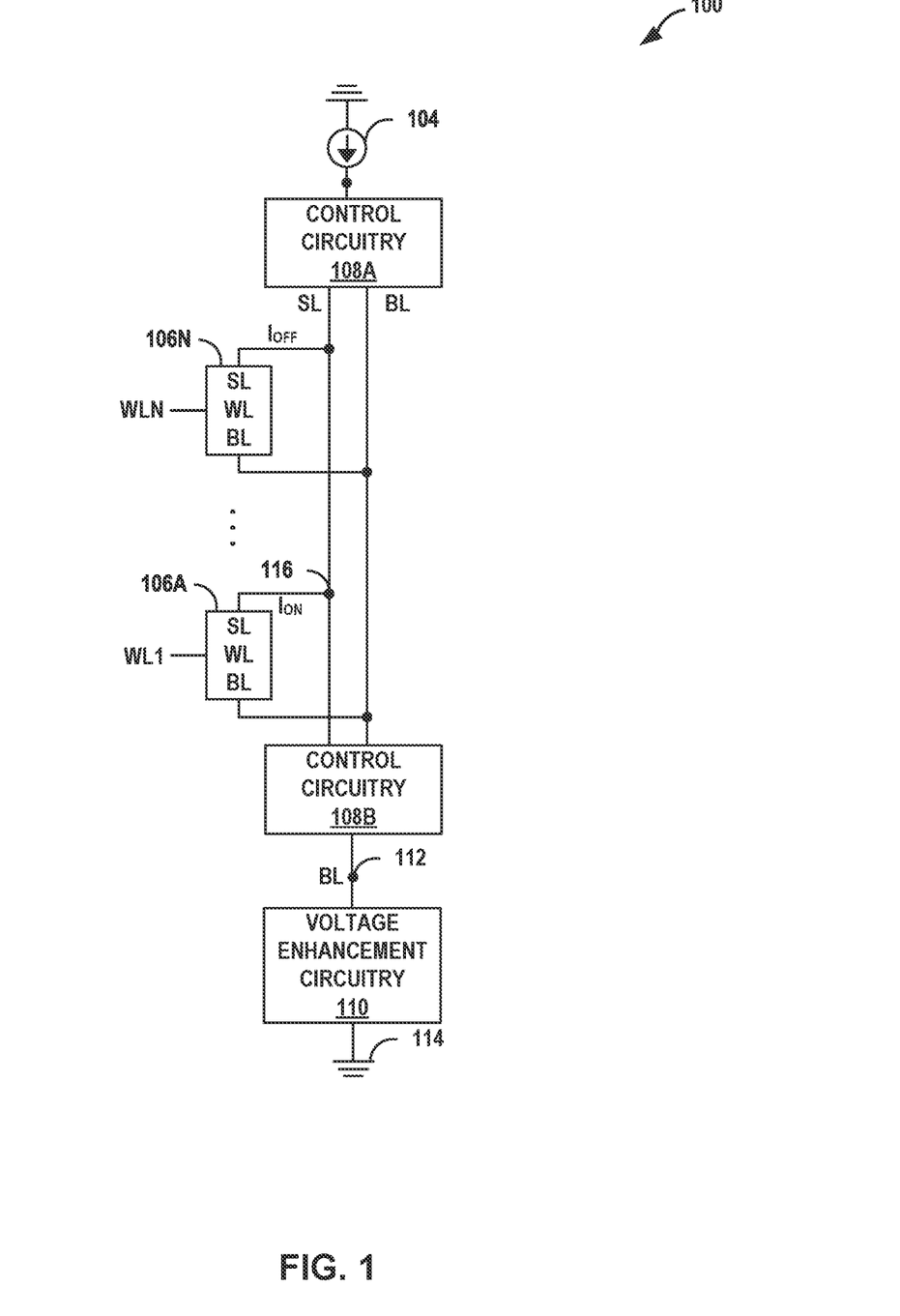
FIG. 1 is a conceptual diagram illustrating an example of a memory array with voltage enhancement circuitry, in accordance with the techniques of the disclosure.

FIG. 1 is a conceptual diagram illustrating an example of a memory array 100 with voltage enhancement circuitry 110, in accordance with the techniques of the disclosure. As shown, memory array 100 includes current source 104, bitcell elements 106A-106N (collectively, bitcell elements 106), control circuitry 108A and 108B (collectively, control circuitry 108), and voltage enhancement circuitry 110. As shown in FIG. 1, bitcell elements 106 form a bitcell column. While FIG. 1 illustrates one column of bitcell cell elements 106, memory array 100 may include more than one bitcell column. For instance, memory array 100 may include hundreds or thousands of bitcell columns.

Current source 104 may be configured to generate a read current during a read operation on the bitcell column formed by bitcell elements 106. Current source 104 may include a voltage source and resistive elements. In some examples, current source 104 may include a MOSFET configured to provide a constant current. While current source 104 is discussed herein with respect to a read current, in some examples current source 104 or another current source may provide a write current for changing a state of bitcell elements 106.

Bitcell elements 106 may be configured to store a state (e.g., 0 or 1). Bitcell elements 106 may be assembled into an array where each column in the array contains N bitcell elements connected to sourceline (SL) 116 and a bitline (BL) 112. While examples herein are directed to bitcell elements 106 configured to store one of two states (e.g., 0 or 1), bitcell elements 106 may be configured to store more than two states. Bitcell elements 106 may include read-only memory (ROM), erasable programmable ROM (EPROM), electrically erasable programmable ROM (EEPROM), ferroelectric memory (FeRAM), magnetic random-access memory (MRAM), phase-change memory (PCM), flash memory or any other volatile or non-volatile memory element. For example, one or more of bitcell elements 106 may include a programmable resistive element.

Control circuitry 108 may be configured to couple current source 104 to the bitcell column formed by bitcell elements 106 such that a read current from current source 104 flows from source line 116, through the bitcell column formed by bitcell elements 106 and voltage enhancement circuitry 110, to reference node 114. Control circuitry 108 may include data selection components, such as, for example, a multiplexer (mux) and demultiplexer. For example, control circuitry 108A may include a multiplexer configured to output read current from current source 104 to the column formed by bitcell elements 106 when a read operation is being performed on the column formed by bitcell elements 106. Control circuitry 108B may include a demultiplexer configured to output the read current from the column formed by bitcell elements 106 to ground when the read operation is being performed on the column formed by bitcell elements 106. In this way, control circuitry 108 may select a column of bitcell elements.

Control circuitry 108 may select a particular bitcell element of bitcell elements 106 by providing an access signal to a wordline of bitcell elements 106. For example, to access bitcell 106A, control circuitry 108 may be configured to, in response to a read request for a particular bitcell element, drive the switching element (e.g., MOSFET) of the particular bitcell element to activate. For instance, control circuitry 108 may provide an access signal (e.g., a logical 1) to wordline '1' (WL1) and provide an unaccessed signal (e.g., a logical 0) to wordline 'n' (WLN) in response to a read request for bitline element 106A.

Control circuitry 108 may include an analog circuit. In some examples, control circuitry 108 may be a microcontroller on a single integrated circuit containing a processor core, memory, inputs, and outputs. For example, control circuitry 108 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, control circuitry 108 may be a combination of one or more analog components and one or more digital components.

Voltage enhancement circuitry 110 may be configured to generate, when the read current flows through voltage enhancement circuitry 110, a voltage at the bitline (BL) 112 that is greater than a voltage at reference node 114. Voltage enhancement circuitry 110 may include a diode. For instance, voltage enhancement circuitry 110 may include a PN diode comprising an anode coupled to bitline 112 and a cathode coupled to reference node 114. Voltage enhancement circuitry 110 may include a Zener diode. For example, the Zener diode may comprise an anode coupled to reference node 114 and a cathode coupled to bitline 112. In some examples, the Zener diode may comprise an anode coupled to bitline 112 and a cathode coupled to reference node 114.

Voltage enhancement circuitry 110 may include a resistor comprising a first node coupled to bitline 112 and a second node coupled to reference node 114.

In some examples, voltage enhancement circuitry 110 may include a switching element. For instance, voltage enhancement circuitry 110 may comprise a diode connected p-channel MOSFET or n-channel MOSFET. Some examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. It should be understood that access circuitry may be high-side or low-side access circuitry. Additionally, switching elements may be voltage-controlled and/or current-controlled. Examples of current-controlled access circuitry may include, but are not limited to, gallium nitride (GaN) MOSFETs, BJTs, or other current-controlled elements.

Control circuitry 108 may be configured to determine a state for each bitcell element of bitcell elements 106 based on a voltage between source line 116 and reference node 114. For example, control circuitry 108 may include a voltage comparator (implemented in hardware or implemented in software) configured to compare the voltage at source line 116 with a reference voltage ($V_{REF}$). In this example, control circuitry 108 may determine that the accessed bitcell element of bitcell elements is in a first state (e.g., 0 or 1) when the voltage at source line 116 is greater than the reference voltage and determine that the accessed bitcell element of bitcell elements is in a second state (e.g., 1 or 0) when the voltage at source line 116 is not greater than the reference voltage.

In operation, control circuitry 108 may select the column formed by bitcell elements 106. The bitline voltage at bitline 112 may be set to Vgnd≈0V plus the voltage provided by voltage enhancement circuitry 110. In this example, control circuitry 108 may set bitcell element 106A ON (e.g., WL1=On) and may set bitcell element 106N OFF (WLN=Off) to determine a state of bitcell element 106A. Current source 104 may supply a read current (Iread) to the selected column SL (i.e., the column formed by bitcell elements 106) and control circuitry 108 compares the resulting voltage drop ($V_{drop}$) across source line (SL) 116 and bitline 112 to a reference voltage ($V_{REF}$) to determine if the resulting $V_{drop}$ across source line (SL) 116 and bitline 112 represents a high or low resistance state.

In systems omitting voltage enhancement circuitry 110, the read current provided by current source 104 (SL_Iread) to the column formed by bitcell elements 106 may include current (Ion) through the access bitcell element (e.g., bitcell element 106A) and leakage current (Ioff) at the N−1 unaccessed bitcell elements (e.g., bitcell element 106N), which may be defined as follows.

$$SL\_Iread = Ion + Ioff*(N-1) \qquad \text{Equation 1}$$

The resulting $V_{drop}$ across source line (SL) 116 and bitline 112, which may be referred to herein as SL_Vsense, may be calculated as follows.

$$SL\_Vsense = Ion*(Rmosfet + Rpre) \qquad \text{Equation 2}$$

wherein Rmosfet is a resistance of a switching element of an accessed bitcell element (e.g., bitcell element 106A) and Rpre is a resistance of a programmable resistive element of the accessed bitcell element.

Using Equations 1 and 2, SL_Vsense may be derived as follows.

$$SL\_Vsense = (SL\_Iread - Ioff*(N-1))*(Rmosfet + Rpre) \qquad \text{Equation 3}$$

That is, SL_Vsense is reduced if the leakage current is greater than zero (Ioff>0). In this example, Rpre may be programmed to a low state (Rpre_l) having a first resistance or a high state (Rpre_h) having a second resistance. As such, the resulting $V_{drop}$ across source line (SL) 116 and bitline 112 may be SL_Vsense_l when the resistance of the programmable resistive element is in a low state and may be SL_Vsense_h when the resistance of the programmable resistive element is in a high state as follows.

$$SL\_Vsense\_l = (SL\_Iread - Ioff*(N-1))*(Rmosfet + Rpre\_l) \qquad \text{Equation 4}$$

$$SL\_Vsense\_h = (SL\_Iread - Ioff*(N-1))*(Rmosfet + Rpre\_h) \qquad \text{Equation 5}$$

As such, the reference voltage ($V_{REF}$) of the read circuit may be set between SL_Vsense_l and SL_Vsense_h. However, if the leakage current (Ioff) is large enough to reduce SL_Vsense_h to <$V_{REF}$ then the high resistance state of the programmable resistive element may not be discerned by control circuitry 108.

In accordance with the techniques of the disclosure, voltage enhancement circuitry 110 may be configured to reduce the leakage current (Ioff) by reducing a drain-to-source voltage ($V_{DS}$) and/or reducing a gate-to-source voltage ($V_{GS}$) to <0V. For instance, voltage enhancement circuitry 110 may reduce both the $V_{DS}$ and the $V_{GS}$ of switching elements of bitcell elements 106 by increasing the source voltage ($V_S$). In the example of FIG. 1, voltage enhancement circuitry 110 may increase the source voltage by increasing the voltage on bitline 112 relative to reference node 114. In some examples, voltage enhancement circuitry 110 includes a diode connected n-channel MOSFET connected between bitline 112 and reference node 114, which may result in a voltage drop (Vdrop) between bitline 112 and reference node 114 that would be approximately a threshold voltage of an n-channel MOSFET (Vt) of voltage enhancement circuitry 110. The threshold voltage of the n-channel MOSFET may be about 0.25 Volts. In other examples, voltage enhancement circuitry 110 may generate other voltages and/or include other components.

In some examples, voltage enhancement circuitry 110 includes a PN junction diode connected between bitline 112 and reference node 114, which would result in a voltage drop ($V_{drop}$) between bitline 112 and reference node 114 equal to a forward voltage of the PN junction diode (e.g., about 0.7 Volts). However, for low $V_{DD}$ technologies a forward voltage of a PN junction diode may be too large. As presented in Equations 6 and 7, voltage enhancement circuitry 110 may include a diode connected n-channel MOSFET for low $V_{DD}$ technologies, which would provide a smaller voltage drop (Nch Vt) than the forward voltage (Vforward) of a PN junction diode.

$$V\text{drop}=Nch\ Vt<V\text{forward} \qquad \text{EQUATION 6}$$

$$V\text{drop}=Nch\ Vt<V_{DD}/2 \qquad \text{EQUATION 7}$$

For example, voltage enhancement circuitry 110 may be configured to generate a voltage of less than 0.6 volts between to the reference node and the bitline when the read current flows through the voltage enhancement circuitry. For instance, voltage enhancement circuitry 110 may include a diode connected n-channel MOSFET that generates a voltage drop of about 0.25 Volts.

The example of FIG. 1 shows one example arrangement of bitline 112 and sourceline 116, however, in other examples, sourceline 116 and bitline 112 may be switched in another arrangement. One or more of bitcell elements 106 may include an n-channel MOSFET. In some examples, one or more of bitcell elements 106 may include a p-channel MOSFET.

Some systems apply a negative voltage on the bitcell wordline (e.g., G) to reduce the leakage current (Ioff). However, techniques described herein using voltage enhancement circuitry 110 may reduce a design complexity and increases a reliability compared to systems that apply a negative voltage on the bitcell Wordline (i.e., G). For example, system 100 may omit a voltage source configured to generate a negative gate voltage. Circuitry for generating the negative voltage may be complex and may be difficult to configure to define a negative voltage compared to using voltage enhancement circuitry 110. In some examples, a negative voltage on the gate (G) may increase $V_{DG}$, which can exceed the allowed the maximum voltage across a gate oxide for long term reliability. Techniques described herein for using voltage enhancement circuitry 110 may provide a simpler circuit that is easier to design, has a smaller area, and better yield and thus a lower cost compared to systems relying on a negative gate voltage. Additionally, techniques described herein for using voltage enhancement circuitry 110 may decrease voltage across the bitcell gate oxide, which may increase long term reliability of system 100.

Figure 2:
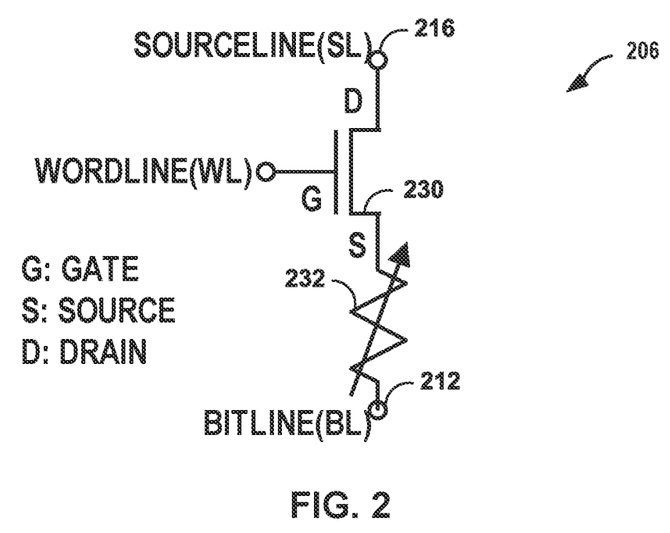
FIG. 2 is a conceptual diagram illustrating an example of a bitcell element, in accordance with the techniques of the disclosure.

FIG. 2 is a conceptual diagram illustrating an example of a bitcell element 206, in accordance with the techniques of the disclosure. Bitcell element 206 may be an example of one or more of bitcell elements 106 of FIG. 1. Bitcell element 206 includes n-type MOSFET 230 and programmable resistive element (Rpre) 232. Bitcell elements 206 may comprise a series string including a first terminal coupled to a source line and a second terminal coupled to a bitline. As shown, the series string may comprise a switching element (e.g., n-type MOSFET 230) coupled in series with a resistive element (e.g., programmable resistive element 232).

Programmable resistive element 232 may be written to a high resistance state (Rpre_h) or low resistance state (Rpre_l). When programmable resistive element 232 is read, the high or low resistance state can be sensed and interpreted as a binary 1 or 0 state respectively (or as a binary 0 or 1 state respectively). Although FIG. 2 illustrates n-type MOSFET 230 as coupled to sourceline 216 and programmable resistive element 232 as coupled to bitline 212, in some examples, n-type MOSFET 230 as coupled to bitline 212 and programmable resistive element 232 as coupled to source line 216.

When bitcell element 206 in a selected column is read, n-type MOSFET 230 is turned on (e.g., by control circuitry 108) to direct current through programmable resistive element 232 (Ion), n-type MOSFET 230 and each of the other N−1 unaccessed bitcell elements is kept off. However, leakage current (Ioff) in the N−1 unaccessed bitcell elements flows parallel to the direct current (Ion) thought programmable resistive element 232 in the on bitcell element. The leakage current may result in an effective parallel leakage resistance to programmable resistive element 232 (e.g., (N−1)*Ioff flows parallel to Ion). The consequence may be a reduction in the read resistance that can be sensed between sourceline 216 and bitline 212. If the leakage current ((N−1)*Ioff) is not significantly less than the direct current (Ion) thought programmable resistive element 232, the resulting difference between the read high and low resistance states can be small enough that the read circuit cannot determine if the resistance state of programmable resistive element 232 is high or low.

Figure 3:
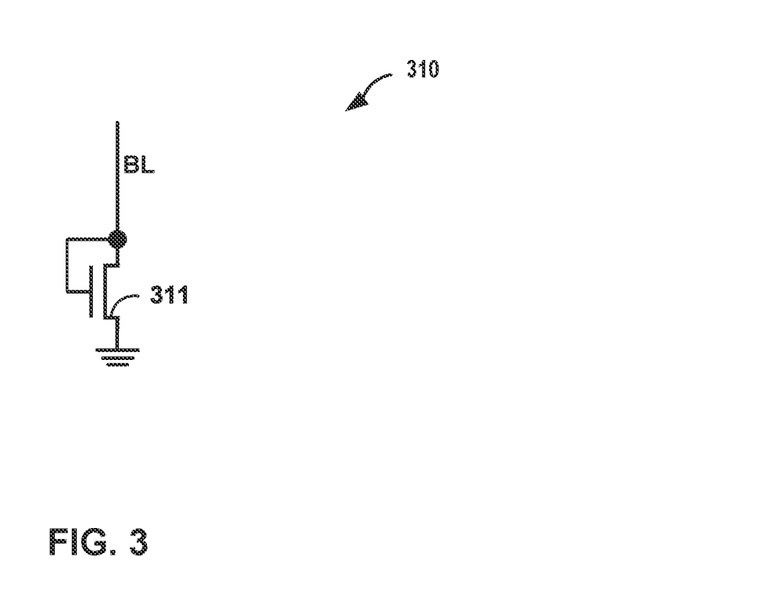
FIG. 3 is a conceptual diagram illustrating first example voltage enhancement circuitry, in accordance with the techniques of the disclosure.

FIG. 3 is a conceptual diagram illustrating first example voltage enhancement circuitry 310, in accordance with the techniques of the disclosure. In this example, voltage enhancement circuitry 310 includes a diode connected n-channel MOSFET 311 comprising a gate coupled to a bitline, a drain coupled to the bitline, and a source coupled to a reference node.

Figure 4:
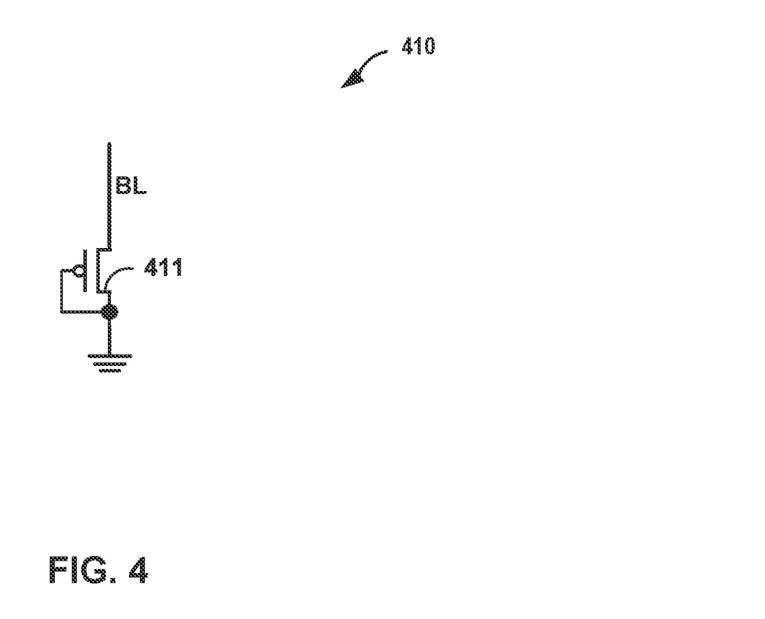
FIG. 4 is a conceptual diagram illustrating second example voltage enhancement circuitry, in accordance with the techniques of the disclosure.

FIG. 4 is a conceptual diagram illustrating second example voltage enhancement circuitry 410, in accordance with the techniques of the disclosure. In this example, voltage enhancement circuitry 410 includes a diode connected p-channel MOSFET 411 comprising a gate coupled to a reference node, a source coupled to a bitline, and a drain coupled to the reference node.

Figure 5:
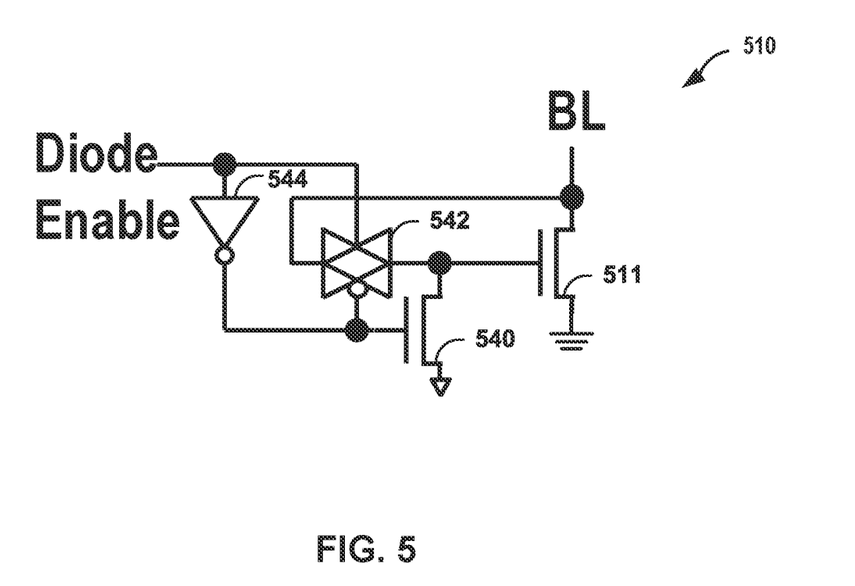
FIG. 5 is a conceptual diagram illustrating third example voltage enhancement circuitry, in accordance with the techniques of the disclosure.

FIG. 5 is a conceptual diagram illustrating third example voltage enhancement circuitry 510, in accordance with the techniques of the disclosure. In this example, voltage enhancement circuitry 510 includes a diode connected n-channel MOSFET 511 comprising a gate, a drain coupled to a bitline, and a source coupled to a reference node.

Voltage enhancement circuitry 510 comprises a diode enable input configured to enable voltage enhancement circuitry 510 to generate a channel that electrically couples the bitline and the reference node during the read request for the bitcell element. For example, voltage enhancement circuitry 510 includes a transmission gate 542 and an inverter 544. Transmission gate 542 and inverter 544 may control n-channel MOSFET 511 to operate as a diode in response to a diode enable signal. For example, the gate of n-channel MOSFET 511 may be controlled to increase functionality such that n-channel MOSFET 511 is enabled when performing a read operation and disabled when not performing the read operation. While this example refers to an n-channel MOSFET, other examples may include a p-channel MOSFET.

Figure 6:
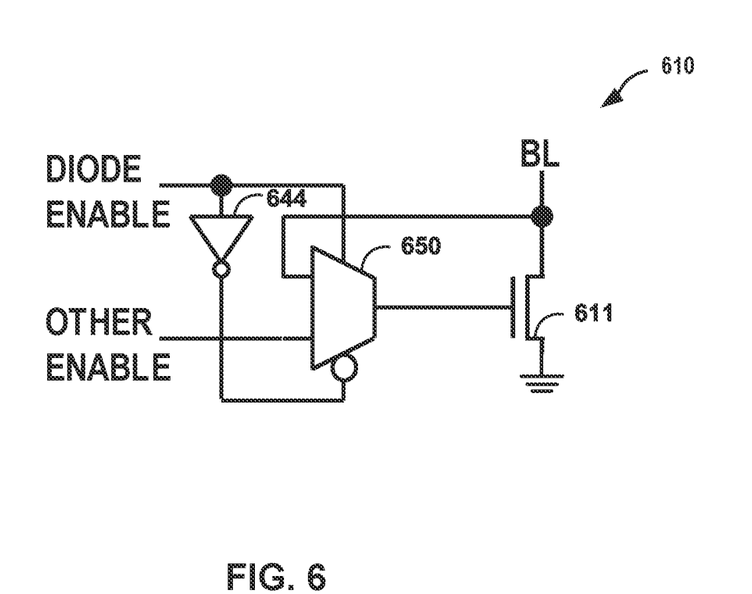
FIG. 6 is a conceptual diagram illustrating fourth example voltage enhancement circuitry, in accordance with the techniques of the disclosure.

FIG. 6 is a conceptual diagram illustrating fourth example voltage enhancement circuitry, in accordance with the techniques of the disclosure. In this example, voltage enhancement circuitry 610 includes a diode connected n-channel MOSFET 611 comprising a gate, a drain coupled to a bitline, and a source coupled to a reference node.

Voltage enhancement circuitry 610 comprises an other enable input configured to drive the voltage enhancement circuitry 610 to generate a channel that electrically couples the bitline and the reference node. For example, voltage enhancement circuitry 610 includes a multiplexer 650 and an inverter 644. Multiplexer 650 and inverter 644 may control n-channel MOSFET 611 to operate as a diode in response to a diode enable signal and other enable signal. For example, the gate of n-channel MOSFET 611 may be controlled to increase functionality such that n-channel MOSFET 611 is enabled when performing a read operation (i.e., the diode enable signal), enabled when performing the other function (i.e., other enable), and disabled when not performing the read operation or the other function.

The other function could be used during a write operation as directed by "other enable" and the other function in the "read other" box. The other function could enable n-channel MOSFET 611 when not doing a read or write as directed by "other enable" and the other function in the "read other" box. Although multiplexer 650 is shown as a 2:1 multiplexer, multiplexer 650 may be an N:1 MUX to add additional functionalities, where N is greater than 2. While this example refers to an n-channel MOSFET, other examples may include a p-channel MOSFET.

Figure 7:
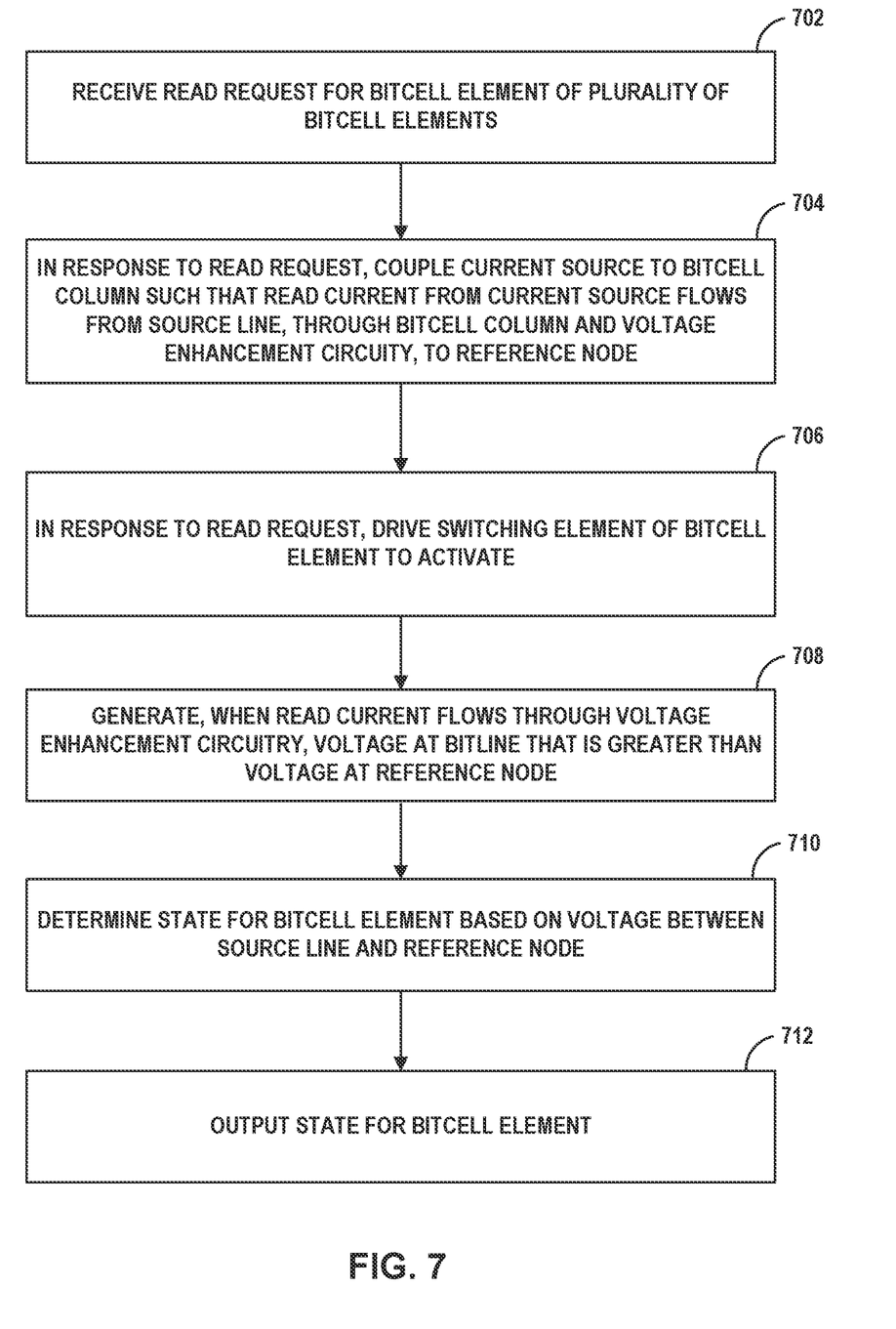
FIG. 7 is a flow chart illustrating an example operation of reading a multiple-access memory device according to one or more techniques of this disclosure.

FIG. 7 is a flow chart illustrating an example operation of reading a multiple-access memory device according to one or more techniques of this disclosure. FIG. 7 is discussed with reference to FIGS. 1-6 for example purposes only.

Control circuitry 108 receives a read request for a bitcell element of a plurality of bitcell elements (702). For example, control circuitry 108 receives a read request for bitcell element 106A of bitcell elements 106A. The plurality of bitcell elements may be arranged in parallel to form a bitcell column (e.g., see bitcell elements 106 of FIG. 1). Each bitcell element of the plurality of bitcell elements may comprise a series string including a first terminal coupled to a source line and a second terminal coupled to a bitline, the series string comprising a switching element coupled in series with a resistive element. For example, each bitcell element of the plurality of bitcell elements may comprise n-type MOSFET 230 arranged in series with programmable resistive element 232.

In response to the read request, control circuitry 108 may couple a current source to the bitcell column such that a read current from the current source flows from the source line, through the bitcell column and voltage enhancement circuitry, to a reference node (704). For example, controller circuit 108 may couple current source 104 to the bitcell column formed by bitcell elements 106 such that a read current from current source 102 flows from source line 116, through the bitcell column formed by bitcell elements 106 and voltage enhancement circuitry 110, to reference node 114.

In response to the read request, control circuitry 108 may drive the switching element of the bitcell to activate (706). For example, controller circuit 108 may provide an access signal (e.g., a logical 1) to wordline '1' (WL1) and provide an unaccessed signal (e.g., a logical 0) to wordline 'n' (WLN) in response to a read request for bitline element 106A.

Voltage enhancement circuitry 110 may be configured to generate, when the read current flows through voltage enhancement circuitry 110, a voltage at bitline 112 that is greater than a voltage at reference node 114 (708). For example, voltage enhancement circuitry 110 may include a diode connected MOSFET. For instance, voltage enhancement circuitry 110 may generate a voltage of less than 0.6 volts between the reference node 114 and bitline 112 when the read current flows through voltage enhancement circuitry 110. Increasing the voltage at bitline 112 may cause voltage enhancement circuitry 110 to reduce a gate-to-source voltage of a switching element of a second bitcell element (e.g., bitcell element 106B) of bitcell elements 106 to be less than zero. For instance, a gate-to-source voltage of a switching element of a second bitcell element (e.g., bitcell element 106B) of bitcell elements 106 may be −0.25 volts when voltage enhancement circuitry 110 generates 0.25 volts between the reference node 114 and bitline 112 and controller circuitry 108 applies a voltage at reference node 114 (e.g., 0 volts).

Control circuitry 110 may determine a state for the bitcell element based on a voltage between source line 116 and reference node 114 (710). For example, control circuitry 108 may determine that the accessed bitcell element of bitcell elements is in a first state (e.g., 0 or 1) when the voltage at source line 116 is greater than the reference voltage and determine that the accessed bitcell element of bitcell elements is in a second state (e.g., 1 or 0) when the voltage at source line 116 is not greater than the reference voltage. Control circuitry 110 may output the state for the bitcell element (712).

Various examples of the disclosure have been described. These and other examples are within the scope of the following claims.

What is claimed is:

1. An apparatus for reading a bit of a memory array, the apparatus comprising:
   a bitcell column comprising a plurality of bitcell elements arranged in parallel, each bitcell element of the plurality of bitcell elements comprising a series string including a first terminal coupled to a source line and a second terminal coupled to a bitline, the series string comprising a switching element coupled in series with a resistive element;
   voltage enhancement circuitry configured to couple the bitline to a reference node;

control circuitry configured to:
in response to a read request for a bitcell element of the plurality of bitcell elements, couple a current source to the bitcell column such that a read current from the current source flows from the source line, through the bitcell column and the voltage enhancement circuitry, to the reference node; and
determine a state for the bitcell element based on a voltage between the source line and the reference node; and
wherein the voltage enhancement circuitry is configured to generate, when the read current flows through the voltage enhancement circuitry, a voltage at the bitline that is greater than a voltage at the reference node.

2. The apparatus of claim 1, wherein the voltage enhancement circuitry is configured to generate a voltage of less than 0.6 volts between to the reference node and the bitline when the read current flows through the voltage enhancement circuitry.

3. The apparatus of claim 1, wherein the voltage enhancement circuitry is configured to reduce a gate-to-source voltage of the switching element of a second bitcell element of the plurality of bitcell elements to be less than zero.

4. The apparatus of claim 1, wherein the voltage enhancement circuitry comprises an n-channel MOSFET comprising a gate coupled to the bitline, a drain coupled to the bitline, and a source coupled to the reference node.

5. The apparatus of claim 1, wherein the voltage enhancement circuitry comprises a p-channel MOSFET comprising a gate coupled to the reference node, a drain coupled to the reference node, and a source coupled to the bitline.

6. The apparatus of claim 1, wherein the voltage enhancement circuitry comprises a diode.

7. The apparatus of claim 1, wherein the voltage enhancement circuitry comprises a diode enable input configured to enable the voltage enhancement circuitry to generate a channel that electrically couples the bitline and the reference node during the read request for the bitcell element.

8. The apparatus of claim 7, wherein the voltage enhancement circuitry comprises an other enable input configured to drive the voltage enhancement circuitry to generate a channel that electrically couples the bitline and the reference node.

9. The apparatus of claim 1, wherein the resistive element of the bitcell element comprises a programmable resistive element.

10. The apparatus of claim 1, wherein the control circuitry is further configured to, in response to the read request for the bitcell element of the plurality of bitcell elements, drive the switching element of the bitcell element to activate.

11. The apparatus of claim 1, wherein the switching element of the bitcell element comprises an n-channel MOSFET or a p-channel MOSFET.

12. An apparatus for reading a bit of a memory array, the apparatus comprising:
a current source configured to generate a read current;
a bitcell column comprising a plurality of bitcell elements arranged in parallel, each bitcell element of the plurality of bitcell elements comprising a series string including a first terminal coupled to a source line and a second terminal coupled to a bitline, the series string comprising a switching element coupled in series with a resistive element;
voltage enhancement circuitry configured to couple the bitline to a reference node;
control circuitry configured to:
in response to a read request for a bitcell element of the plurality of bitcell elements, couple a current source to the bitcell column such that the read current from the current source flows from the source line, through the bitcell column and the voltage enhancement circuitry, to the reference node; and
determine a state for the bitcell element based on a voltage between the source line and the reference node; and
wherein the voltage enhancement circuitry is configured to generate, when the read current flows through the voltage enhancement circuitry, a voltage at the bitline that is greater than a voltage at the reference node.

13. The apparatus of claim 12, wherein the voltage enhancement circuitry is configured to generate a voltage of less than 0.6 volts between to the reference node and the bitline when the read current flows through the voltage enhancement circuitry.

14. The apparatus of claim 12, wherein the voltage enhancement circuitry is configured to reduce a gate-to-source voltage of the switching element of a second bitcell element of the plurality of bitcell elements to be less than zero.

15. The apparatus of claim 12, wherein the voltage enhancement circuitry comprises an n-channel MOSFET comprising a gate coupled to the bitline, a drain coupled to the bitline, and a source coupled to the reference node.

16. The apparatus of claim 12, wherein the voltage enhancement circuitry comprises a p-channel MOSFET comprising a gate coupled to the reference node, a drain coupled to the reference node, and a source coupled to the bitline.

17. The apparatus of claim 12, wherein the voltage enhancement circuitry comprises a diode.

18. The apparatus of claim 12, wherein the voltage enhancement circuitry comprises a diode enable input configured to enable the voltage enhancement circuitry to generate a channel that electrically couples the bitline and the reference node during the read request for the bitcell element.

19. The apparatus of claim 18, wherein the voltage enhancement circuitry comprises an other enable input configured to drive the voltage enhancement circuitry to generate a channel that electrically couples the bitline and the reference node.

20. A method of operating a memory device comprising:
receiving a read request for a bitcell element of a plurality of bitcell elements, wherein the plurality of bitcell elements are arranged in parallel to form a bitcell column, each bitcell element of the plurality of bitcell elements comprising a series string including a first terminal coupled to a source line and a second terminal coupled to a bitline, the series string comprising a switching element coupled in series with a resistive element;
in response to the read request, coupling a current source to the bitcell column such that a read current from the current source flows from the source line, through the bitcell column and voltage enhancement circuitry, to a reference node, wherein the voltage enhancement circuitry is configured to generate, when the read current flows through the voltage enhancement circuitry, a voltage at the bitline that is greater than a voltage at the reference node; and determining a state for the bitcell element based on a voltage between the source line and the reference node.

* * * * *